United States Patent
Kaneko et al.

(10) Patent No.: US 9,822,453 B2
(45) Date of Patent: Nov. 21, 2017

(54) SUBSTRATE PROCESSING APPARATUS, SUBSTRATE PROCESSING METHOD AND STORAGE MEDIUM STORING SUBSTRATE PROCESSING PROGRAM

(71) Applicant: Tokyo Electron Limited, Tokyo (JP)

(72) Inventors: Satoshi Kaneko, Koshi (JP); Kazuki Motomatsu, Koshi (JP); Kazunori Sakamoto, Koshi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 349 days.

(21) Appl. No.: 14/560,332

(22) Filed: Dec. 4, 2014

(65) Prior Publication Data

US 2015/0159276 A1    Jun. 11, 2015

(30) Foreign Application Priority Data

Dec. 5, 2013  (JP) ................................. 2013-252102

(51) Int. Cl.
| | |
|---|---|
| H01L 21/30 | (2006.01) |
| H01L 21/68 | (2006.01) |
| C25D 21/12 | (2006.01) |
| C23C 18/16 | (2006.01) |
| H01L 21/306 | (2006.01) |

(52) U.S. Cl.
CPC ...... *C23C 18/1675* (2013.01); *C23C 18/1619* (2013.01); *C23C 18/1664* (2013.01); *C25D 21/12* (2013.01); *H01L 21/306* (2013.01); *H01L 21/68* (2013.01)

(58) Field of Classification Search
CPC ..... H01L 21/302; H01L 21/68; H01L 21/288; C25D 21/12
USPC .................... 118/52; 427/284, 240
See application file for complete search history.

(56) References Cited

U.S. PATENT DOCUMENTS

| | | | |
|---|---|---|---|
| 6,352,747 B1 * | 3/2002 | Blackburn | G02B 1/10 118/320 |
| 6,626,996 B1 * | 9/2003 | Amigh | A21C 9/04 118/13 |
| 7,644,512 B1 * | 1/2010 | Liu | C11D 11/0041 118/65 |

(Continued)

FOREIGN PATENT DOCUMENTS

JP    2013-213263 A    10/2013

*Primary Examiner* — Cachet Sellman
(74) *Attorney, Agent, or Firm* — Pearne & Gordon LLP

(57) ABSTRACT

A substrate entire region treatment process of discharging a processing fluid of a temperature different from a surface temperature of a substrate 3 from a first nozzle 24 toward the substrate is performed while moving the first nozzle toward an outer side from an entire region treatment start position P2 located at a central portion to an entire region treatment end position P5 located at a peripheral portion. Then, after moving the first nozzle toward an inner side to a peripheral region treatment start position P6 located at an outer position than the entire region treatment start position P2, a substrate peripheral region treatment process of discharging the processing fluid from the first nozzle toward the substrate is performed while moving the first nozzle toward the outer side from the peripheral region treatment start position P6 to a peripheral region treatment stop position P7 located at a peripheral portion.

15 Claims, 5 Drawing Sheets

(56) References Cited

U.S. PATENT DOCUMENTS

| | | | | |
|---|---|---|---|---|
| 8,794,251 B2* | 8/2014 | Ostervold | ............... | B05B 1/207 |
| | | | | 134/123 |
| 2001/0039117 A1* | 11/2001 | Ito | .......................... | B05D 1/005 |
| | | | | 438/689 |
| 2003/0211756 A1* | 11/2003 | Ito | ..................... | H01L 21/02126 |
| | | | | 438/782 |
| 2006/0013953 A1* | 1/2006 | Winter | ................ | H01L 21/6715 |
| | | | | 427/240 |
| 2011/0195190 A1* | 8/2011 | Koshiyama | .............. | C09K 3/18 |
| | | | | 427/284 |
| 2014/0356531 A1* | 12/2014 | Sato | ........................ | G03F 7/162 |
| | | | | 427/240 |

* cited by examiner

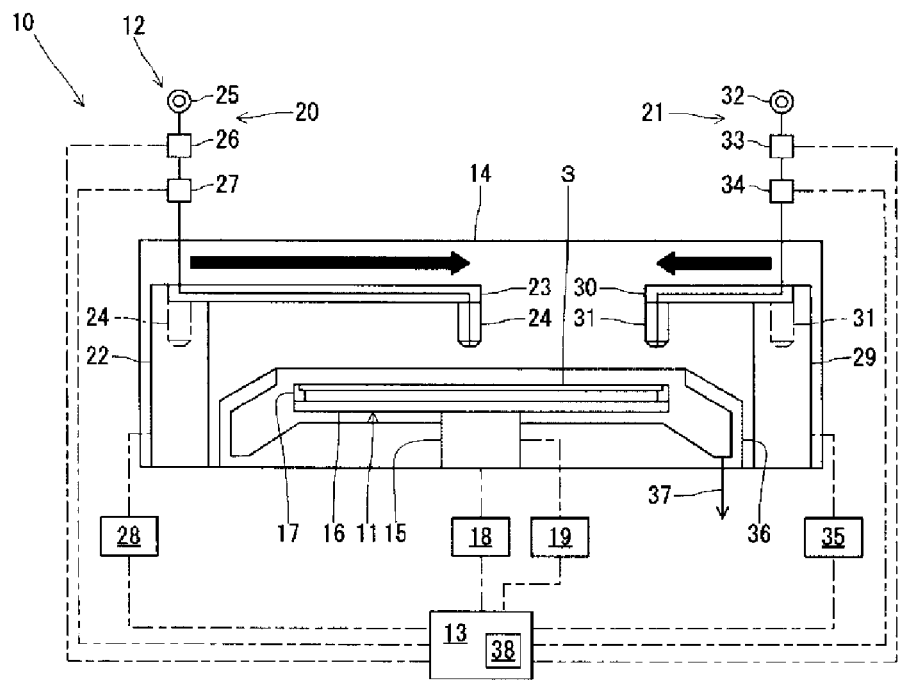
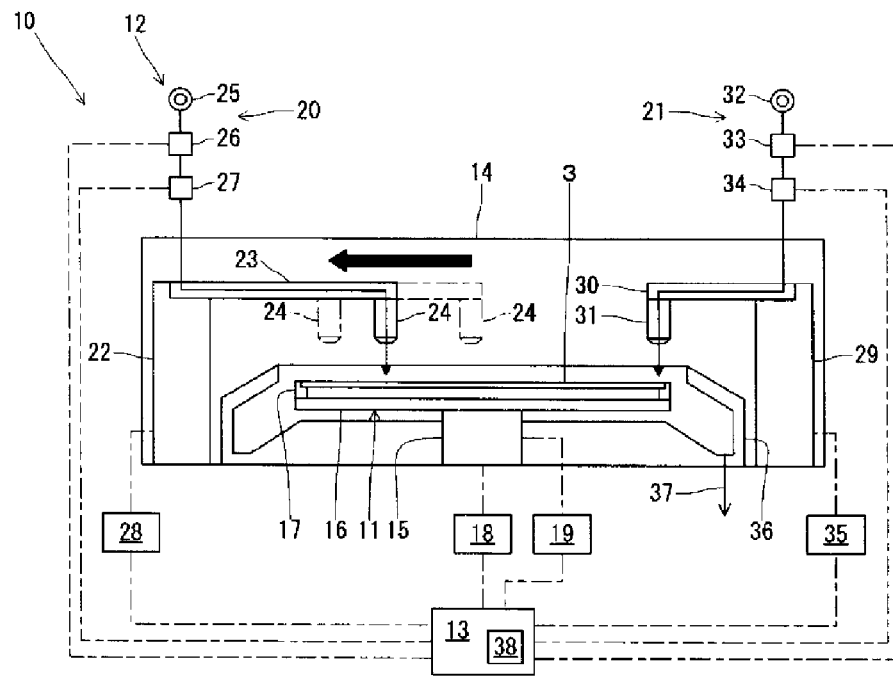

SUBSTRATE PROCESSING APPARATUS, SUBSTRATE PROCESSING METHOD AND STORAGE MEDIUM STORING SUBSTRATE PROCESSING PROGRAM

CROSS-REFERENCE TO RELATED APPLICATION

This application claims the benefit of Japanese Patent Application No. 2013-252102 filed on Dec. 5, 2013, the entire disclosures of which are incorporated herein by reference.

TECHNICAL FIELD

The embodiments described herein pertain generally to a substrate processing apparatus and a substrate processing method of processing a substrate with a processing fluid having a temperature different from a surface temperature of the substrate, and, also, to a storage medium storing a substrate processing program therein.

BACKGROUND

Conventionally, when manufacturing semiconductor components, flat panel displays, or the like, various kinds of processes such as cleaning, etching and plating are performed on a substrate such as a semiconductor wafer or a liquid crystal substrate by using a substrate processing apparatus.

As an example, a substrate processing apparatus that performs a plating process on a circuit pattern formed on a surface (a main surface, i.e., a surface on which the circuit pattern is formed) of a substrate includes a substrate rotating unit that rotates the substrate while holding the substrate horizontally; and a processing fluid discharging unit that discharges a processing fluid for plating (plating liquid) toward the surface of the substrate from a nozzle, which is movable along the surface of the substrate. Here, the plating liquid is set to be of a temperature higher than a surface temperature (room temperature) of the substrate. In this substrate processing apparatus, by discharging the plating liquid from the nozzle toward the surface of the substrate being rotated while moving the nozzle from a start position at a central portion of the substrate to an end position at an edge portion of the substrate, preset portions on the surface of the substrate are plated (see, for example, Patent Document 1).

Patent Document 1: Japanese Patent Laid-open Publication No. 2013-213263

Since, however, the processing fluid having the temperature different from the surface temperature of the substrate is used in the conventional substrate processing apparatus, a surface temperature at an outer region of the substrate becomes lower than a surface temperature at an inner region of the substrate if the processing fluid is discharged onto the surface of the substrate in a range from the start position at the central portion of the substrate toward the end position at the edge portion thereof. The reason why the temperature at the outer region of the substrate becomes lower may include heat dissipation from a peripheral end of the substrate or a difference in a rotational speed in a circumferential direction between the inner region and the outer region of the substrate being rotated (the rotational speed at the outer region is higher).

The performance of the plaiting liquid depends on the temperature of the plating liquid. Thus, if the surface temperature of the substrate is not uniform, it may be difficult to plate the preset portions on the surface of the substrate in a uniform manner, so that the substrate may not be processed effectively.

SUMMARY

In one example embodiment, a substrate processing apparatus includes a substrate rotating unit configured to rotate a substrate while holding the substrate; a processing fluid discharging unit, having a first nozzle that is movable along the substrate, configured to discharge a processing fluid of a temperature different from a surface temperature of the substrate from the first nozzle; and a control unit configured to control the substrate rotating unit and the processing fluid discharging unit. Further, the control unit controls the substrate rotating unit to rotate the substrate, the control unit performs a substrate entire region treatment process of discharging the processing fluid from the first nozzle toward the substrate while moving the first nozzle of the processing fluid discharging unit toward an outer side of the substrate from a preset position corresponding to an entire region treatment start position, which is located at a central portion of the substrate, to a preset position corresponding to an entire region treatment end position, which is located at a peripheral portion of the substrate; and after moving the first nozzle toward an inner side of the substrate to a preset position corresponding to a peripheral region treatment start position, which is located at an outer position of the substrate than the entire region treatment start position, the control unit performs a substrate peripheral region treatment process of discharging the processing fluid from the first nozzle toward the substrate while moving the first nozzle toward the outer side of the substrate from the peripheral region treatment start position to a preset position corresponding to a peripheral region treatment stop position, which is located at a peripheral portion of the substrate.

In the substrate peripheral region treatment process, the control unit may discharge the processing fluid from the first nozzle toward the substrate while moving the first nozzle toward the inner side of the substrate to the peripheral region treatment start position.

In the substrate entire region treatment process, the control unit may discharge the processing fluid from the first nozzle toward the substrate while moving the first nozzle toward the inner side of the substrate to the entire region treatment start position.

The processing fluid discharging unit may further include a second nozzle configured to discharge a processing fluid toward a preset position located at an outer position of the substrate than the peripheral region treatment stop position.

The processing fluid discharging unit may be configured to discharge the processing fluids of different temperatures from the first nozzle and the second nozzle, respectively.

The control unit may repeat the substrate peripheral region treatment process multiple times while changing the peripheral region treatment start position to be an outer position of the substrate for each time.

The control unit may alternately repeat the substrate entire region treatment process and the substrate peripheral region treatment process multiple times.

In another example embodiment, a substrate processing method includes performing a substrate entire region treatment process of processing a substrate by discharging a processing fluid having a temperature different from a surface temperature of the substrate from a first nozzle toward the substrate while moving the first nozzle toward an outer side of the substrate from a preset position corresponding to an entire region treatment start position, which is located at a central portion of the substrate, to a preset position corresponding to an entire region treatment end position, which is located at a peripheral portion of the substrate; and after moving the first nozzle toward an inner side of the substrate to a preset position corresponding to a peripheral region treatment start position, which is located at an outer position of the substrate than the entire region treatment start position, performing a substrate peripheral region treatment process of processing the substrate by discharging the processing fluid from the first nozzle toward the substrate while moving the first nozzle toward the outer side of the substrate from the peripheral region treatment start position to a preset position corresponding to a peripheral region treatment stop position, which is located at a peripheral portion of the substrate.

In the substrate peripheral region treatment process, the processing fluid may be discharged from the first nozzle toward the substrate while the first nozzle is being moved toward the inner side of the substrate to the peripheral region treatment start position.

In the substrate entire region treatment process, the processing fluid may be discharged from the first nozzle toward the substrate while the first nozzle is being moved toward the inner side of the substrate to the entire region treatment start position.

A processing fluid may be discharged from a second nozzle toward the substrate at a preset position located at an outer position of the substrate than the peripheral region treatment stop position.

The processing fluids of different temperatures may be discharged from the first nozzle and the second nozzle, respectively.

The substrate peripheral region treatment process may be repeated multiple times while changing the peripheral region treatment start position to be an outer position of the substrate for each time.

The substrate entire region treatment process and the substrate peripheral region treatment process may be alternately repeated multiple times.

In yet another example embodiment, a computer-readable storage medium has stored thereon computer-executable instructions that, in response to execution, cause a substrate processing apparatus to process a substrate. Further, the substrate processing apparatus includes a substrate rotating unit configured to rotate a substrate while holding the substrate; a processing fluid discharging unit, having a first nozzle that is movable along the substrate, configured to discharge a processing fluid of a temperature different from a surface temperature of the substrate from the first nozzle; and a control unit configured to control the substrate rotating unit and the processing fluid discharging unit. Furthermore, the control unit controls the substrate rotating unit to rotate the substrate, the control unit performs a substrate entire region treatment process of discharging the processing fluid from the first nozzle toward the substrate while moving the first nozzle of the processing fluid discharging unit toward an outer side of the substrate from a preset position corresponding to an entire region treatment start position, which is located at a central portion of the substrate, to a preset position corresponding to an entire region treatment end position, which is located at a peripheral portion of the substrate; and after moving the first nozzle toward an inner side of the substrate to a preset position corresponding to a peripheral region treatment start position, which is located at an outer position of the substrate than the entire region treatment start position, the control unit performs a substrate peripheral region treatment process of discharging the processing fluid from the first nozzle toward the substrate while moving the first nozzle toward the outer side of the substrate from the peripheral region treatment start position to a preset position corresponding to a peripheral region treatment stop position, which is located at a peripheral portion of the substrate.

According to the example embodiments, temperature uniformity of a substrate can be improved, and a surface of the substrate can be processed effectively.

The foregoing summary is illustrative only and is not intended to be in any way limiting. In addition to the illustrative aspects, embodiments, and features described above, further aspects, embodiments, and features will become apparent by reference to the drawings and the following detailed description.

BRIEF DESCRIPTION OF THE DRAWINGS

In the detailed description that follows, embodiments are described as illustrations only since various changes and modifications will become apparent to those skilled in the art from the following detailed description. The use of the same reference numbers in different figures indicates similar or identical items.

FIG. 5 is an explanatory diagram illustrating an operation of the plating apparatus (preparing process);

FIG. 6 is an explanatory diagram illustrating an operation of the plating apparatus (substrate entire region treatment process);

DETAILED DESCRIPTION

Figure 1:
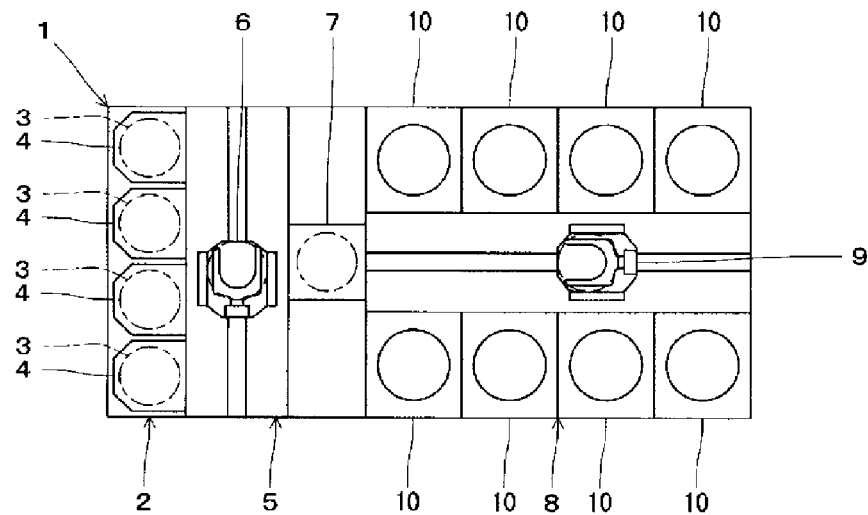
FIG. 1 is a plane view illustrating a substrate processing apparatus.

In the following detailed description, reference is made to the accompanying drawings, which form a part of the description. In the drawings, similar symbols typically identify similar components, unless context dictates otherwise. Furthermore, unless otherwise noted, the description of each successive drawing may reference features from one or more of the previous drawings to provide clearer context and a more substantive explanation of the current example embodiment. Still, the example embodiments described in the detailed description, drawings, and claims are not meant to be limiting. Other embodiments may be utilized, and other changes may be made, without departing from the spirit or scope of the subject matter presented herein. It will be readily understood that the aspects of the present disclosure, as generally described herein and illustrated in the drawings, may be arranged, substituted, combined, separated, and designed in a wide variety of different configurations, all of which are explicitly contemplated herein.

Hereinafter, a substrate processing apparatus, a substrate processing method and a substrate processing program in accordance with an example embodiment will be described in detail with reference to the accompanying drawings, which form a part of the description.

As depicted in FIG. 1, a substrate processing apparatus 1 includes a loading/unloading unit 2 provided at a front end thereof. Carriers 4, each of which accommodates therein a multiple number (for example, 25 sheets) of substrates 3 (here, semiconductor wafers), are loaded into or unloaded from the loading/unloading unit 2. In the loading/unloading unit 2, the carriers 4 are mounted side by side in a left-and-right direction.

Further, the substrate processing apparatus 1 includes a transfer unit 5 provided at the rear side of the loading/unloading unit 2. The transfer unit 5 includes a substrate transfer device 6 at the front side thereof and a substrate transit table 7 at the rear side thereof. In this transfer unit 5, the substrate 3 is transferred between one of the carriers 4 mounted in the loading/unloading unit 2 and the substrate transit table 7 by using the substrate transfer device 6.

A processing unit 8 is provided at the rear side of the transfer unit 5 within the substrate processing apparatus 1. A substrate transfer device 9 extended in a forward-backward direction is provided at a central portion of the processing unit 8, and plating devices 10 each configured to perform a plating process on the substrate 3 are arranged side by side at the left and right sides of the substrate transfer device 9 in the forward-backward direction. In this processing unit 8, the substrate 3 is transferred between the substrate transit table 7 and the plating process 10 by using the substrate transfer device 9, and a liquid process is performed on the substrate 3 by using the plating device 10.

Figure 2:
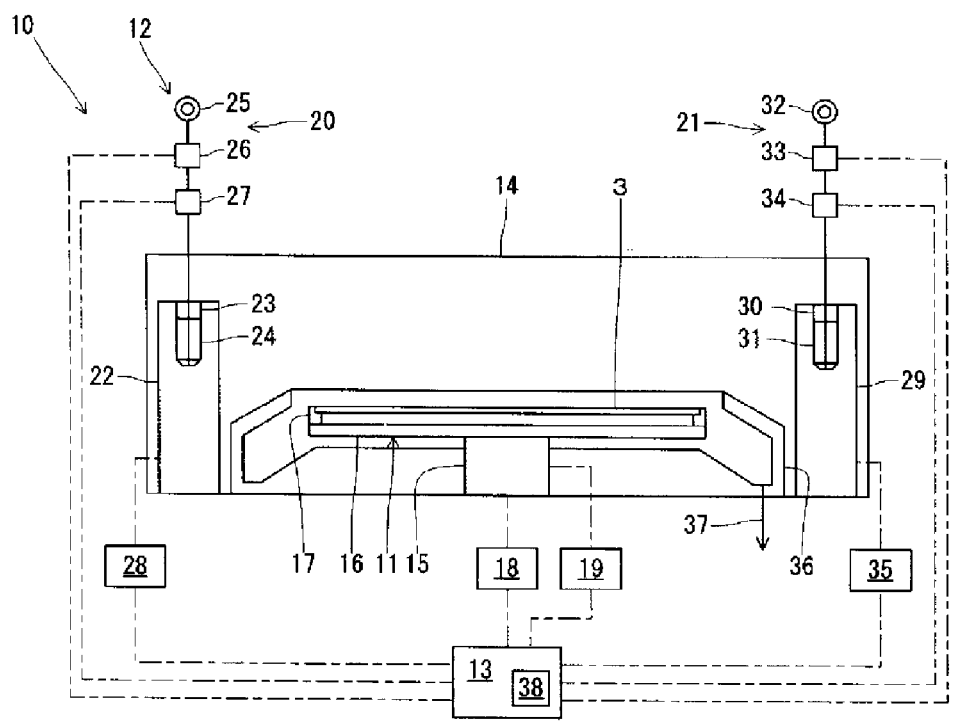
FIG. 2 is a side view illustrating a plating apparatus.
Figure 3:
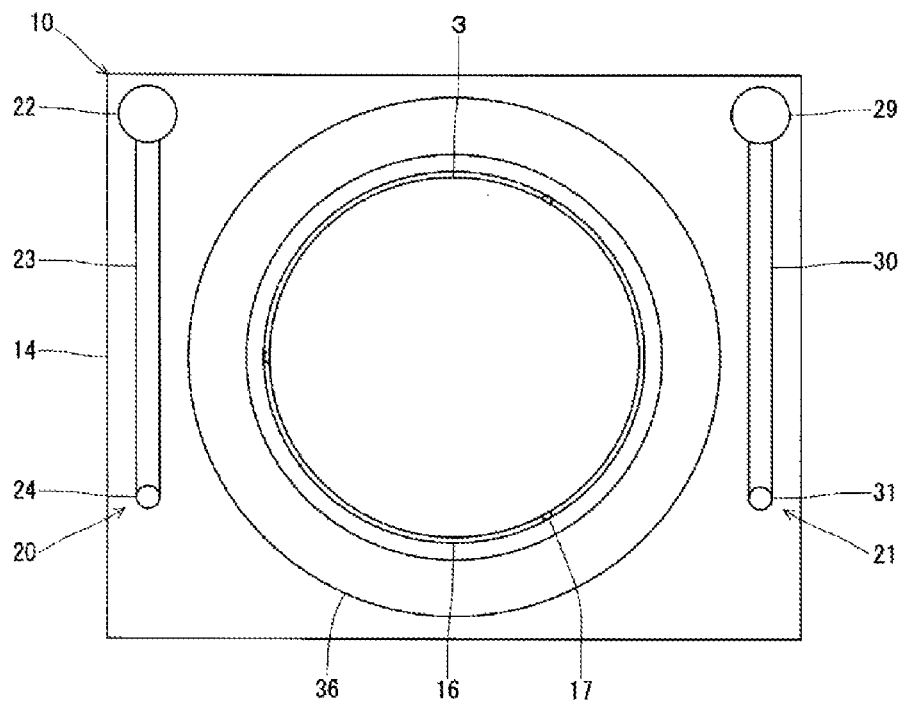
FIG. 3 is a plane view illustrating the plating apparatus.

Each plating device 10 includes, as illustrated in FIG. 2 and FIG. 3, a substrate rotating unit 11 configured to rotate the substrate 3 while holding the substrate 3 thereon; a processing fluid discharging unit 12 configured to discharge a processing fluid (plating liquid) onto the substrate 3; and a control unit 13 configured to control the substrate rotating unit 11 and the processing fluid discharging unit 12.

The substrate rotating unit 11 includes a vertically extended rotation shaft 15 which is rotatably disposed at a substantially central portion within a substrate processing chamber 14. A circular plate-shaped turntable 16 is horizontally mounted on an upper end of the rotation shaft 15. A multiple number of substrate holders 17 are arranged at the edge of the turntable 16 at a regular interval therebetween along the circumference of the turntable 16.

Further, in the substrate rotating unit 11, a substrate rotating device 18 and a substrate elevating device 19 are connected to the rotation shaft 15. A rotation of the substrate rotating device 18 and a vertical movement of the substrate elevating device 19 are controlled by the control unit 13.

The substrate rotating unit 11 is configured to hold thereon the substrate 3 horizontally by the substrate holders 17 of the turntable 16. Further, the substrate rotating unit 11 is configured to rotate the substrate 3 on the turntable 16 by the substrate rotating device 18 and move the turntable 16 and the substrate 3 up and down by the substrate elevating device 19.

The processing fluid discharging unit 12 includes a first processing fluid discharging unit 20 configured to discharge a processing fluid onto the entire region of the substrate 3 ranging from a central portion thereof to an outer peripheral portion thereof; and a second processing fluid discharging unit 21 configured to discharge a processing fluid onto a peripheral region ranging from the peripheral portion of the substrate 3 to an outer edge peripheral portion thereof.

The first processing fluid discharging unit 20 includes a vertically extended rotation shaft 22 which is rotatably disposed in an inner left portion of the substrate processing chamber 14. A horizontally extended arm 23 is provided on an upper end of the rotation shat 22. A first nozzle 24 is fastened to a leading end of the arm 23 to face downward. A first processing fluid supply source 25 configured to supply a plating liquid as a first processing fluid is connected to the first nozzle 24 via a temperature controller 26 and a flow rate controller 27. The temperature controller 26 and the flow rate controller 27 are controlled by the control unit 13.

The first processing fluid discharging unit 20 also includes a first nozzle moving device 28 connected to the rotation shaft 22. The first nozzle moving device 28 is controlled by the control unit 13.

The first processing fluid discharging unit 20 moves the first nozzle 24 between the central portion of the substrate 3 and a left-side position outside the substrate 3 by the first nozzle moving device 28, and, also, discharges the first processing fluid adjusted to a preset temperature by the temperature controller 26 toward a surface (top surface) of the substrate 3 from the first nozzle 24. Here, the temperature of the first processing fluid is set to be higher than a temperature (surface temperature, i.e., room temperature) of the substrate 3.

The second processing fluid discharging unit 21 includes a vertically extended rotation shaft 29 which is rotatably disposed in an inner right portion of the substrate processing chamber 14. A horizontally extended arm 30 is provided on an upper end of the rotation shat 29. A second nozzle 31 is fastened to a leading end of the arm 30 to face downward. A second processing fluid supply source 32 configured to supply a plating liquid as a second processing fluid is connected to the second nozzle 31 via a temperature controller 33 and a flow rate controller 34. The temperature controller 33 and the flow rate controller 34 are controlled by the control unit 13.

The second processing fluid discharging unit 21 also includes a second nozzle moving device 35 connected to the rotation shaft 29. The second nozzle moving device 35 is controlled by the control unit 13.

The second processing fluid discharging unit 21 moves the second nozzle 31 between the peripheral portion of the substrate 3 and a right-side position outside the substrate 3 by the second nozzle moving device 35, and, also, discharges the second processing fluid adjusted to a preset temperature by the temperature controller 33 toward the surface (top surface) of the substrate 3 from the second nozzle 31. Here, the temperature of the second processing fluid is set to be higher than the temperature (surface temperature, i.e., room temperature) of the substrate 3 and the temperature of the first processing fluid.

Further, a circular ring-shaped collection cup 36 is provided within the substrate processing chamber 14 to surround the turntable 16. The collection cup 36 has an opening at an upper end thereof, and the opening has a size larger than the turntable 16. Further, a drain 37 is connected to a lower end of the collection cup 36. The processing fluid scattered from the substrate 2 is collected by the collection cup 36, and then, drained out to the outside through the drain 37.

The substrate processing apparatus 1 is configured as described above and is controlled by the control unit 13 to perform a preset process on the substrate 3 according to various kinds of programs recorded in a storage medium 38 installed in the control unit 13 (computer). Here, the storage medium 38 stores thereon various kinds of setup data or programs and may be implemented by a memory such as a ROM or a RAM, or a disk-type storage medium such as a hard disk, a CD-ROM, DVD-ROM or a flexible disk, as commonly known in the art.

To perform a plating process on the substrate 3 by using the plating device 10, the substrate processing apparatus 1 performs a process on the substrate 3 according to a substrate processing program (see FIG. 4) stored in the storage medium 38, as will be described below.

Figure 4:
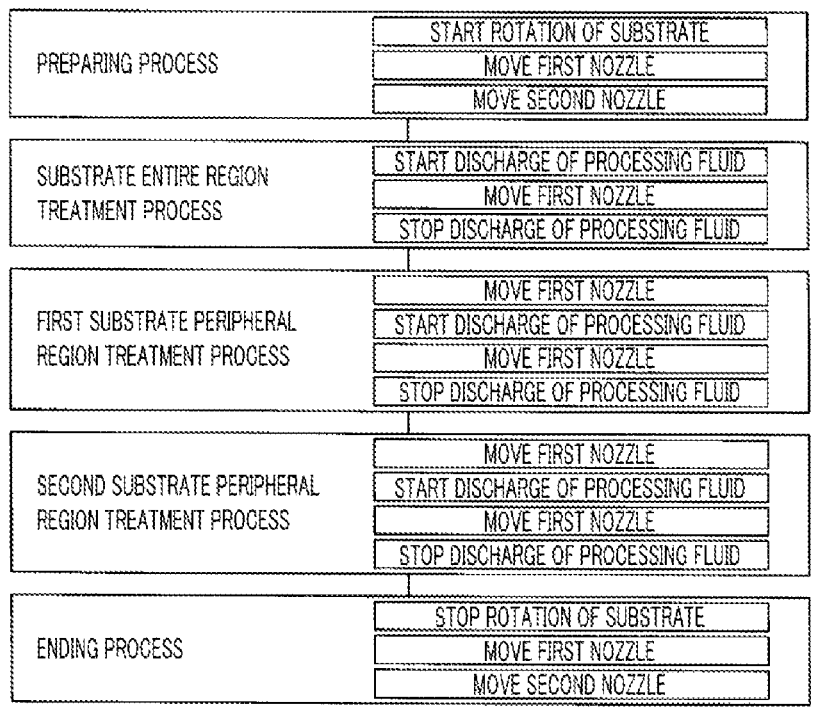
FIG. 4 is a flowchart for describing a substrate processing program.
Figure 9:
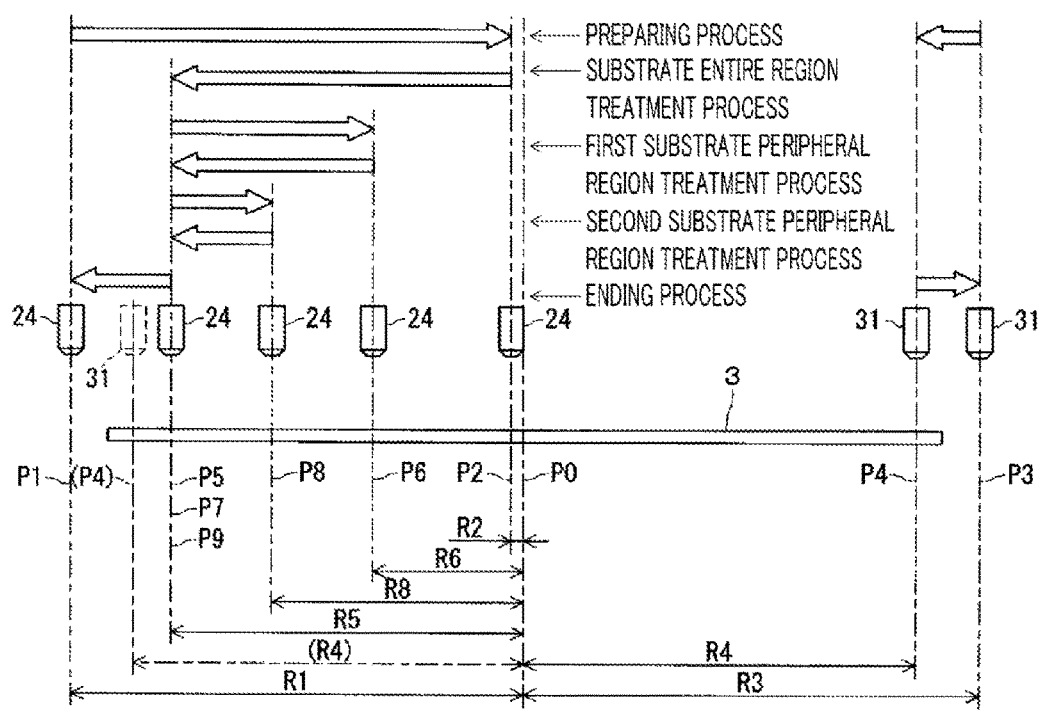
FIG. 9 is an explanatory diagram schematically illustrating an operation of the plating apparatus.

First, as depicted in FIG. 4, FIG. 5 and FIG. 9, the substrate processing apparatus 1 rotates the substrate 3 and moves the first nozzle 24 and the second nozzle 31 to preset positions above the substrate 3 (preparing process).

In this preparing process, by rotating the turntable 16 at a preset rotational speed through the substrate rotating device 18, the substrate 3 is also rotated at the preset rotational speed. Further, by rotating the arm 23 through the first nozzle moving device 28, the first nozzle 24 is moved toward an inner side of the substrate 3 from a preset external position (first nozzle retreat position P1) outside the substrate 3 to a preset position (entire region treatment start position P2) above the central portion of the substrate 3. The entire region treatment start position P2 is slightly deviated outward from a center position P0 of the substrate 3. Further, by rotating the arm 30 through the second nozzle moving device 35, the second nozzle 31 is moved toward an inner side of the substrate 3 from a preset external position (second nozzle retreat position P3) outside the substrate 3 to a preset position (fixed position P4) above the peripheral portion of the substrate 3.

Here, the first nozzle retreat position P1, the entire region treatment start position P2, the second nozzle retreat nozzle P3 and the fixed position P4 are spaced apart from the center position P0 of the substrate 3 by a distance of R1, R2, R3 and R4, respectively, in a radial direction thereof.

Then, the substrate processing apparatus 1 processes the surface of the substrate 3 ranging from a central portion thereof to an edge portion thereof (entire region of the substrate 3) with a processing fluid (substrate entire region treatment process), as depicted in FIG. 4, FIG. 6 and FIG. 9.

In this substrate entire region treatment process, the first processing fluid adjusted to a preset temperature by the temperature controller 26 is discharged toward the surface of the substrate 3 from the first nozzle 24 after its flow rate is adjusted to a preset value by the flow rate controller 27. Further, the second processing fluid adjusted to a preset temperature by the temperature controller 33 is also discharged toward the surface of the substrate 3 from the second nozzle 31 after its flow rate is adjusted to a preset value by the flow rate controller 34. Further, by rotating the arm 23 through the first nozzle moving device 28, the first nozzle 24 is moved toward an outer side of the substrate 3 from the entire region treatment start position P2 to a preset position (entire region treatment end position P5) above the peripheral portion of the substrate 3. The second nozzle 31 is held at the fixed position P4. Thereafter, the discharge of the processing fluid from the first and second nozzles 24 and 31 is stopped by the flow rate controllers 27 and 34, respectively.

Here, the entire region treatment end position P5 is spaced apart deviated from the center position P0 of the substrate 3 by a distance of R5 in a radial direction. This entire region treatment end position P5 of the first nozzle 24 is located at an inner position on the substrate 3 than the fixed position P4 of the second nozzle 31. Accordingly, the first processing fluid discharged from the first nozzle 24 and the second processing fluid discharged from the second nozzle 31 can be suppressed from being dispersed after colliding with each other at an outer peripheral edge portion of the substrate 3. Also, the first and second processing fluids can be smoothly flown out into the collection cup 36 outside the substrate 3.

In this substrate entire region treatment process, the processing fluid is supplied over the entire region of the substrate 3 ranging from the central portion of the substrate 3 to the edge portion thereof, so that the entire surface of the substrate 3 is processed by the processing fluid.

In the above-described substrate entire region treatment process, after moving the first nozzle 24 to the entire region treatment start position P2 without discharging the processing fluid from the first nozzle 24, the processing fluid is discharged from the first nozzle 24 toward the substrate 3, while moving the first nozzle 24 from the entire region treatment start position P2 to the entire region treatment end position P5. However, the example embodiment may not be limited thereto, and the processing fluid may also be discharged from the first nozzle 24 toward the substrate 3 in a range from the peripheral portion of the substrate 3 to the central portion thereof while the first nozzle 24 is being moved to the entire region treatment start position P2. In this way, by discharging the processing fluid from the first nozzle 24 in the range from the peripheral portion of the substrate 3 to the central portion thereof when moving the first nozzle 24 to the entire region treatment start position P2, it is possible to suppress generation of a temperature discrepancy between the central portion of the substrate 3 and the peripheral portion thereof.

Figure 7:
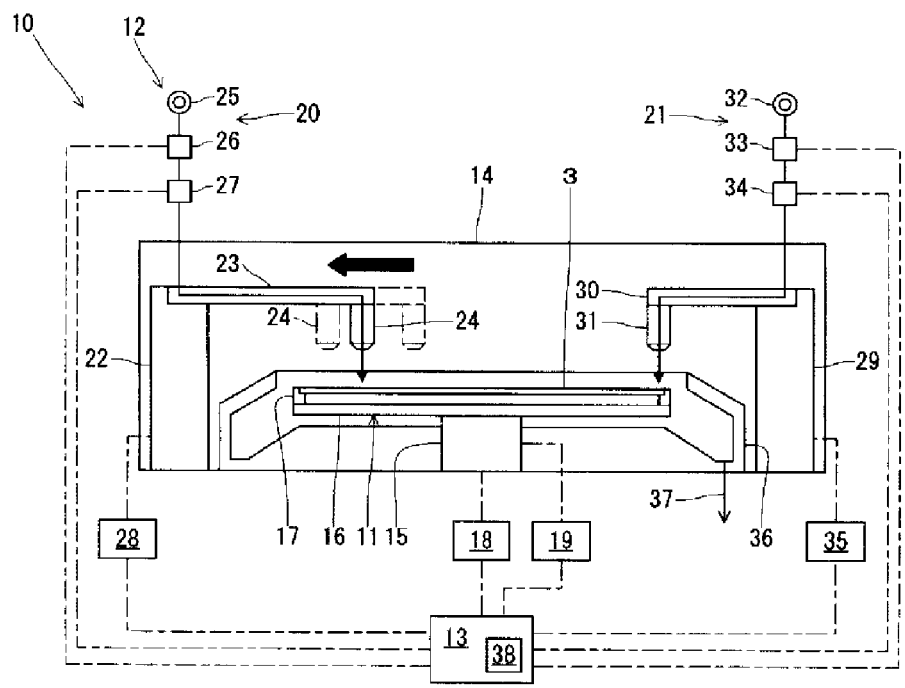
FIG. 7 is an explanatory diagram illustrating an operation of the plating apparatus (first substrate peripheral region treatment process)

Subsequently, as depicted in FIG. 4, FIG. 7 and FIG. 9, the substrate processing apparatus 1 processes the surface of the substrate 3 in a range from the outer peripheral edge portion of the substrate to an inner side (i.e., a peripheral region of the substrate 3) with the processing fluid (first substrate peripheral region treatment process).

In this first substrate peripheral region treatment process, by rotating the arm 23 through the first nozzle moving device 28, the first nozzle 24 is moved toward an inner side of the substrate 3 from the entire region treatment end position P5 to a preset position (first peripheral region treatment start position P6), which is located at an outer position on the substrate 3 than the entire region treatment start position P2. At this time, the second nozzle 31 is held at the fixed position P4. Further, the processing fluid may be discharged from the first nozzle 24 toward the substrate 3 while moving the first nozzle 24 to the first peripheral region treatment start position P6.

Thereafter, in the first substrate peripheral region treatment process, the first processing fluid adjusted to a preset temperature by the temperature controller 26 is discharged toward the surface of the substrate 3 from the first nozzle 24 after its flow rate is adjusted to a preset value by the flow rate controller 27. Further, the second processing fluid adjusted to a preset temperature by the temperature controller 33 is also discharged toward the surface of the substrate 3 from the second nozzle 31 while its flow rate is adjusted to a preset value by the flow rate controller 34. Further, by rotating the arm 23 through the first nozzle moving device 28, the first nozzle 24 is moved toward an outer side of the substrate 3 from the first peripheral region treatment start position P6 to a preset position (first peripheral region treatment stop position P7) above a peripheral portion of the substrate 3. The second nozzle 31 is held at the fixed position P4. Thereafter, the discharge of the processing fluid from the first and second nozzles 24 and 31 is stopped by the flow rate controllers 27 and 34, respectively.

Here, the first peripheral region treatment start position P6 is spaced apart from the center position P0 of the substrate 3 by a distance of R6 in the radial direction. The first peripheral region treatment start position P6 in this first substrate peripheral region treatment process is located at an outer position on the substrate 3 than the entire region treatment start position P2 in the substrate entire region treatment process. Accordingly, in the first substrate peripheral region treatment process, the first nozzle 24 is moved in a narrower processing range on the peripheral region of the substrate 3 than a processing range in the substrate entire region treatment process. Further, the first peripheral region treatment stop position P7 is spaced apart from the center position P0 of the substrate 3 by the distance of R5 in the radial direction, which is the same position as the entire region treatment end position P5. Alternatively, the first peripheral region treatment stop position P7 may be different from the entire region treatment end position P5.

In this first substrate peripheral region treatment process, the processing fluid is supplied onto the surface of the peripheral region of the substrate 3, and the surface of the peripheral region of the substrate 3, which has a range narrower than the processing range in the substrate entire region treatment process, is processed by the processing fluid.

Figure 8:
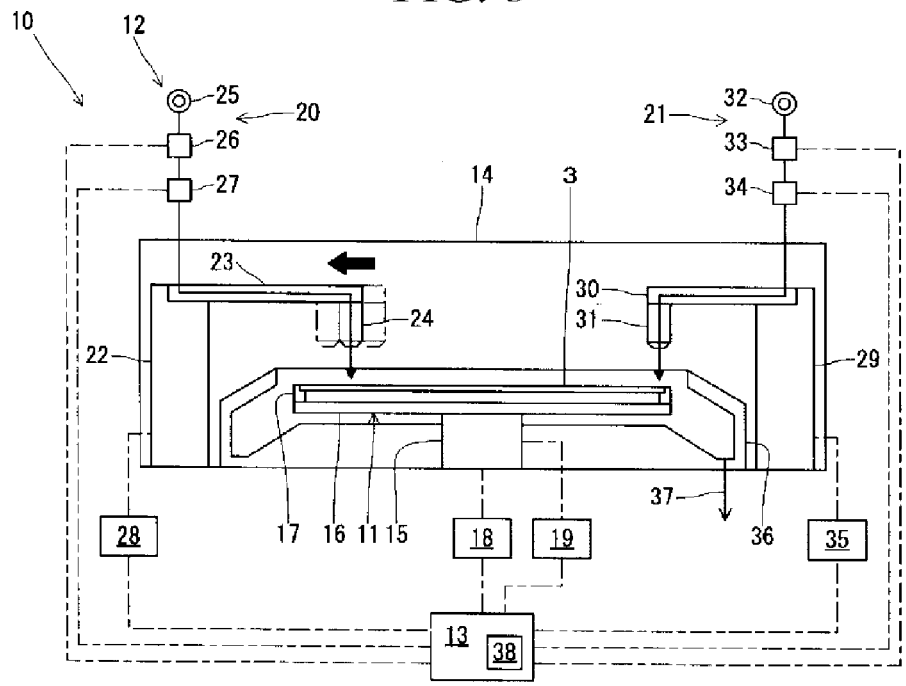
FIG. 8 is an explanatory diagram illustrating an operation of the plating apparatus (second substrate peripheral region treatment process)

Thereafter, as depicted in FIG. 4, FIG. 8 and FIG. 9, the substrate processing apparatus 1 processes, by the processing fluid, the surface of the substrate 3 in a range from the outer peripheral edge portion of the substrate 3 to an inner side (peripheral region of the substrate 3), which is narrower than the processing range in the first substrate peripheral region treatment process (second substrate peripheral region treatment process).

In this second substrate peripheral region treatment process, by rotating the arm 23 through the first nozzle moving device 28, the first nozzle 24 is moved toward an inner side of the substrate 3 from the first peripheral region treatment stop position P7 to a preset position (second peripheral region treatment start position P8) located at an inner side of the substrate 3 than the first peripheral region treatment stop position P7. At this time, the second nozzle 31 is held at the fixed position P4. Here, the processing fluid may be discharged toward the substrate 3 from the first nozzle 24 while moving the first nozzle 24 to the second peripheral region treatment start position P8.

Thereafter, in the second substrate peripheral region treatment process, the first processing fluid adjusted to a preset temperature by the temperature controller 26 is discharged toward the surface of the substrate 3 from the first nozzle 24 after its flow rate is adjusted to a preset value by the flow rate controller 27. Further, the second processing fluid adjusted to a preset temperature by the temperature controller 33 is also discharged toward the surface of the substrate 3 from the second nozzle 31 after its flow rate is adjusted to a preset value by the flow rate controller 34. Further, by rotating the arm 23 through the first nozzle moving device 28, the first nozzle 24 is moved toward an outer side of the substrate 3 from the second peripheral region treatment start position P8 to a preset position (second peripheral region treatment stop position P9) above a peripheral portion of the substrate 3. At this time, the second nozzle 31 is held at the fixed position P4. Thereafter, the discharge of the processing fluids from the first and second nozzles 24 and 31 is stopped by the flow rate controllers 27 and 34, respectively.

Here, the second peripheral region treatment start position P8 is spaced apart from the center position P0 of the substrate 3 by a distance of R8 in the radial direction. The second peripheral region treatment start position P8 in this second substrate peripheral region treatment process is located at an outer position on the substrate 3 than the entire region treatment start position P2 in the substrate entire region treatment process and the first peripheral region treatment start position P6 in the first substrate peripheral region treatment process. Accordingly, in the second substrate peripheral region treatment process, the first nozzle 24 is moved within a narrower processing range on the peripheral region of the substrate 3 than the processing ranges in the substrate entire region treatment process and the first substrate peripheral region treatment process. Furthermore, the second peripheral region treatment stop position P9 is spaced apart from the center position P0 of the substrate 3 by the distance of R5 in the radial direction, which is the same as the entire region treatment end position P5 and the first peripheral region treatment stop position P7. Alternatively, the second peripheral region treatment stop position P9 may be different from the entire region treatment end position P5 or the first peripheral region treatment stop position P7.

In this second substrate peripheral region treatment process, the processing fluid is supplied onto the surface of the peripheral region of the substrate 3, and the surface of the substrate 3 on the peripheral region, which has a range narrower than the processing ranges in the substrate entire region treatment process and in the first substrate peripheral region treatment process, is processed by the processing fluid.

Subsequently, as depicted in FIG. 4 and FIG. 9, the substrate processing apparatus 1 stops the rotation of the substrate 3 and retreats the first nozzle 24 and the second nozzle 31 to the preset external positions outside the periphery of the substrate 3 (ending process).

In this ending process, the rotation of the substrate 3 is stopped by stopping the turntable 16 through the substrate rotating device 18. Further, by rotating the arm 23 through the first nozzle moving device 28, the first nozzle 24 is moved toward an outer side of the substrate 3 from the second peripheral region treatment stop position P9 to the first nozzle retreat position P1. Also, by rotating the arm 30 through the second nozzle moving device 35, the second nozzle 31 is moved toward an outer side of the substrate 3 from the fixed position P4 toward the second nozzle retreat position P3.

In the substrate processing apparatus 1, the plating process is performed on the surface of the substrate 3 by repeating the above-described substrate entire region treatment process and substrate peripheral region treatment process. At this time, the substrate peripheral region treatment process of processing the peripheral region of the substrate 3 is performed after the substrate entire region treatment process of processing the entire region of the substrate 3 is performed. If only the substrate entire region treatment process is performed, the temperature of the processing fluid is different from the surface temperature of the substrate 3 and a supply amount of the processing fluid per a unit area at the outer peripheral portion of the substrate 3 is smaller than a supply amount of the processing fluid at the inner peripheral portion thereof, so that the temperature variations at the central portion of the substrate 3 and at the peripheral portion of the substrate 3 may be different from each other. As a result, the surface temperature of the substrate 3 may not be uniform. To solve this problem, by performing the substrate peripheral region treatment process after the substrate entire region treatment process, generation of a temperature discrepancy between the central portion of the substrate 3 and the peripheral portion thereof can be suppressed, and uniformity of the surface temperature of the substrate 3 can be improved.

In the above-described substrate processing apparatus 1, the substrate peripheral region treatment process is performed in two stages: the first substrate peripheral region treatment process; and the second substrate peripheral region treatment process of processing a processing range narrower than the processing range in the first substrate peripheral region treatment process. In this way, by repeatedly performing the substrate peripheral region treatment process multiple times while moving the peripheral region treatment start position (the first peripheral region treatment start position P6 and the second peripheral region treatment start position P8) outward toward the outer peripheral edge portion of the substrate 3 gradually, the uniformity of the surface temperature of the substrate 3 can be improved more precisely. Here, the repetition number of the substrate entire region treatment process or the substrate peripheral region treatment process may be appropriately selected depending on the size of the substrate 3 or the like.

Further, in the above-described substrate processing apparatus 1, there is provided the second nozzle 31 configured to discharge the processing fluid at the preset position (fixed position P4) located at the peripheral portion of the substrate 3 outer than the first and second peripheral region treatment stop positions P7 and P9 of the first nozzle 24. The processing fluid is discharged from the second nozzle 31 toward the peripheral portion of the substrate 3. Accordingly, a temperature variation at the peripheral portion near the outer peripheral edge portion of the substrate 3 can be suppressed, so that the uniformity of the surface temperature of the substrate 3 can be further improved. Especially, the processing fluids having temperatures different from each other are discharged from the first nozzle 24 and the second nozzle 31, respectively, so that the uniformity of the surface temperature of the substrate 3 can be precisely improved. Furthermore, by setting a flow rate of the processing fluid discharged from the first nozzle 24 to be larger than a flow rate of the processing fluid discharged from the second nozzle 31, the processing fluid can be smoothly introduced from the outer peripheral edge portion of the substrate 3 into the collection cup 36 located outside the substrate 3. Furthermore, if it is also possible to improve the uniformity of the surface temperature of the substrate 3 by suppressing generation of the temperature discrepancy between the central portion and the peripheral portion of the substrate 3 through the first nozzle 24, the second nozzle 31 may be omitted and the substrate treatment may be performed by using only the first nozzle 24.

In the substrate entire region treatment process or the substrate peripheral region treatment process, the processing fluid may be discharged from the first nozzle 24 toward the substrate 3 only while moving the first nozzle 24 from an inner side of the substrate 3 toward an outer side thereof. Further, the processing fluid may also be discharged from the first nozzle 24 toward the substrate 3 while moving the first nozzle from an outer side the substrate 3 toward an inner side thereof as well. By discharging the processing fluid toward the substrate 3 while moving the first nozzle 24 from the outer side toward the inner side of the substrate 3 as well as while moving the first nozzle 24 from the inner side toward the outer side of the substrate 3, generation of the temperature discrepancy between the central portion and the peripheral portion of the substrate 3 can be further suppressed, so that the uniformity of the surface temperature of the substrate 3 can be more improved.

As stated above, the substrate processing apparatus 1 is configured to perform the substrate peripheral region treatment process of processing the peripheral region of the substrate 3 after performing the substrate entire region treatment process of processing the entire region of the substrate 3 when processing the surface of the substrate 3 with the processing fluid having a temperature different from the surface temperature of the substrate 3. Thus, in the substrate processing apparatus 1 having the above-described configuration, the temperature uniformity of the substrate 3 can be improved, and the surface of the substrate 3 can be processed effectively.

Moreover, the above-described substrate processing apparatus 1 is configured to perform a plating process by using a plating liquid as the processing fluid. However, the example embodiment is not limited to the plating process and may be applied to various kinds of substrate processing apparatuses configured to perform processes on the substrate 3 with a processing fluid such as a cleaning liquid, a rinse liquid or an etching liquid having a temperature different from the surface temperature of the substrate 3 to be processed to achieve a uniform reaction rate by improving uniformity of the surface temperature of the substrate 3.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

We claim:

1. A substrate processing apparatus, comprising:
a substrate rotating unit configured to rotate a substrate while holding the substrate;
a processing fluid discharging unit, having a first nozzle that is movable along the substrate, configured to discharge a processing fluid of a temperature different from a surface temperature of the substrate from the first nozzle; and
a control unit configured to control the substrate rotating unit and the processing fluid discharging unit,
wherein the control unit controls the substrate rotating unit to rotate the substrate,
the control unit performs a substrate entire region treatment process of discharging the processing fluid from the first nozzle toward the substrate while moving the first nozzle of the processing fluid discharging unit toward an outer side of the substrate from a preset position corresponding to an entire region treatment start position, which is located at a central portion of the substrate, to a preset position corresponding to an entire region treatment end position, which is located at a peripheral portion of the substrate; and
after the substrate entire region treatment process, the control unit moves the first nozzle toward an inner side of the substrate to a preset position corresponding to a peripheral region treatment start position, which is located at an outer position of the substrate from the entire region treatment start position and an inner position of the substrate from the entire region treatment end position, and
the control unit performs a substrate peripheral region treatment process of discharging the processing fluid from the first nozzle toward the substrate while moving the first nozzle toward the outer side of the substrate from the peripheral region treatment start position to a preset position corresponding to a peripheral region treatment stop position, which is located at a peripheral portion of the substrate.

2. The substrate processing apparatus of claim 1, wherein, in the substrate peripheral region treatment process, the control unit discharges the processing fluid from the first nozzle toward the substrate while moving the first nozzle toward the inner side of the substrate to the peripheral region treatment start position.

3. The substrate processing apparatus of claim 1, wherein, in the substrate entire region treatment process, the control unit discharges the processing fluid from the first nozzle toward the substrate while moving the first nozzle toward the inner side of the substrate to the entire region treatment start position.

4. The substrate processing apparatus of claim 1, wherein the processing fluid discharging unit further includes a second nozzle configured to discharge a processing fluid toward a preset position located at an outer position of the substrate from the peripheral region treatment stop position.

5. The substrate processing apparatus of claim 4, wherein the processing fluid discharging unit is configured to discharge the processing fluids of different temperatures from the first nozzle and the second nozzle, respectively.

6. The substrate processing apparatus of claim 1, wherein the control unit repeats the substrate peripheral region treatment process multiple times while changing the peripheral region treatment start position to be an outer position of the substrate for each time.

7. The substrate processing apparatus of claim 1, wherein the control unit alternately repeats the substrate entire region treatment process and the substrate peripheral region treatment process multiple times.

8. A substrate processing method, comprising:
performing a substrate entire region treatment process of processing a substrate by discharging a processing fluid having a temperature different from a surface temperature of the substrate from a first nozzle toward the substrate while moving the first nozzle toward an outer side of the substrate from a preset position corresponding to an entire region treatment start position, which is located at a central portion of the substrate, to a preset position corresponding to an entire region treatment end position, which is located at a peripheral portion of the substrate;
after the substrate entire region treatment process, moving the first nozzle toward an inner side of the substrate to a preset position corresponding to a peripheral region treatment start position, which is located at an outer position of the substrate from the entire region treatment start position and an inner position of the substrate from the entire region treatment end position; and
performing a substrate peripheral region treatment process of processing the substrate by discharging the processing fluid from the first nozzle toward the substrate while moving the first nozzle toward the outer side of the substrate from the peripheral region treatment start position to a preset position corresponding to a peripheral region treatment stop position, which is located at a peripheral portion of the substrate.

9. The substrate processing method of claim 8, wherein, in the substrate peripheral region treatment process, the processing fluid is discharged from the first nozzle toward the substrate while the first nozzle is being moved toward the inner side of the substrate to the peripheral region treatment start position.

10. The substrate processing method of claim 8, wherein, in the substrate entire region treatment process, the processing fluid is discharged from the first nozzle toward the substrate while the first nozzle is being moved toward the inner side of the substrate to the entire region treatment start position.

11. The substrate processing method of claim 8, wherein a processing fluid is discharged from a second nozzle toward the substrate at a preset position located at an outer position of the substrate from the peripheral region treatment stop position.

12. The substrate processing method of claim 11, wherein the processing fluids of different temperatures are discharged from the first nozzle and the second nozzle, respectively.

13. The substrate processing method of claim 8, wherein the substrate peripheral region treatment process is repeated multiple times while changing the peripheral region treatment start position to be an outer position of the substrate for each time.

14. The substrate processing method of claim 8, wherein the substrate entire region treatment process and the substrate peripheral region treatment process are alternately repeated multiple times.

15. A computer-readable storage medium having stored thereon computer-executable instructions that, in response to execution, cause a substrate processing apparatus to process a substrate,
wherein the substrate processing apparatus comprising:
a substrate rotating unit configured to rotate the substrate while holding the substrate;
a processing fluid discharging unit, having a first nozzle that is movable along the substrate, configured to discharge a processing fluid of a temperature different from a surface temperature of the substrate from the first nozzle; and
a control unit configured to control the substrate rotating unit and the processing fluid discharging unit,
wherein the control unit controls the substrate rotating unit to rotate the substrate,
the control unit performs a substrate entire region treatment process of discharging the processing fluid from the first nozzle toward the substrate while moving the first nozzle of the processing fluid discharging unit toward an outer side of the substrate from a preset position corresponding to an entire region treatment start position, which is located at a central portion of the substrate, to a preset position corresponding to an entire region treatment end position, which is located at a peripheral portion of the substrate; and
after the substrate entire region treatment process, the control unit moves the first nozzle toward an inner side of the substrate to a preset position corresponding to a peripheral region treatment start position, which is located at an outer position of the substrate from the entire region treatment start position and an inner position of the substrate from the entire region treatment end position, and the control unit performs a substrate peripheral region treatment process of discharging the processing fluid from the first nozzle toward the substrate while moving the first nozzle toward the outer side of the substrate from the peripheral region treatment start position to a preset position corresponding to a peripheral region treatment stop position, which is located at a peripheral portion of the substrate.

* * * * *